(12) United States Patent
Yonemitsu et al.

(10) Patent No.: US 8,171,620 B2
(45) Date of Patent: May 8, 2012

(54) COMPONENT SUPPLYING APPARATUS AND SURFACE MOUNTING MACHINE

(75) Inventors: Masanori Yonemitsu, Iwata (JP); Tomokazu Ohnuki, Iwata (JP)

(73) Assignee: Yamaha Hatsudoki Kabushiki Kaisha (JP)

( * ) Notice: Subject to any disclaimer, the term of this patent is extended or adjusted under 35 U.S.C. 154(b) by 525 days.

(21) Appl. No.: 12/441,954

(22) PCT Filed: Sep. 21, 2007

(86) PCT No.: PCT/JP2007/068388
§ 371 (c)(1),
(2), (4) Date: Mar. 19, 2009

(87) PCT Pub. No.: WO2008/035764
PCT Pub. Date: Mar. 27, 2008

(65) Prior Publication Data
US 2010/0071204 A1    Mar. 25, 2010

(30) Foreign Application Priority Data
Sep. 21, 2006  (JP) ................. 2006-256240

(51) Int. Cl.
*B23P 19/00*    (2006.01)
(52) U.S. Cl. ........................................... 29/822
(58) Field of Classification Search .............. 29/822, 29/806, 50, 52; 206/713; 221/72; 414/416.08
See application file for complete search history.

(56) References Cited

U.S. PATENT DOCUMENTS
5,050,650 A    9/1991  Holcomb et al.

FOREIGN PATENT DOCUMENTS
| JP | 2000-332489 A | 11/2000 |
| JP | 2001-237592 A | 8/2001 |
| JP | 2004-128007 A | 4/2004 |
| JP | 2005-175200 A | 6/2005 |

OTHER PUBLICATIONS
The Extended European Search Report dated Jul. 7, 2010; Application No. 07807720.3-2214/ 2066165 PCT/JP2007068388.

*Primary Examiner* — John C Hong
(74) *Attorney, Agent, or Firm* — Studebaker & Brackett PC; Donald R. Studebaker

(57) ABSTRACT

A component supplying apparatus and a reel can be easily and integrally managed when not supplying components, and the component supplying apparatus can be made to be compact when the component supplying apparatus and the reel are not integrally managed. The component supplying apparatus (50) has an apparatus main body section (53), provided with a feeding apparatus (52) for pulling out a tape (TP), which holds components at fixed intervals, from a reel (80) toward a prescribed component supplying position, and a main body frame (500) on which the feeding apparatus (52) is mounted. The component supplying apparatus (50) is removably mounted on a surface mounting machine (10). The component supplying apparatus (50) is provided with an engaging section (100) as reel holder, which is mounted on the apparatus main body section (53) and is displaced between a holding position where the reel (80) is held and a storing position where the reel (80) is not held.

12 Claims, 9 Drawing Sheets

COMPONENT SUPPLYING APPARATUS AND SURFACE MOUNTING MACHINE

TECHNICAL FIELD

The present invention relates to a component supplying apparatus and a surface mounting machine.

BACKGROUND ART

A component supplying apparatus referred to as a so-called tape feeder is known in the prior art as a supplier for supplying components for mounting, and that is installed on a surface mounting machine. For example, a component supplying apparatus described in Japanese Patent Application Laid-open No. 2005-175200 employs a configuration that a tape housing a large number of components at fixed intervals is fed to a component removal position in front of a feeder while pulling out from a reel installed on the component supplying apparatus, and the components are extracted at this position by a surface mounting head provided on a surface mounting machine.

However, as many component supplying apparatuses as possible are required to be arranged in a single surface mounting machine in order to minimize setup work as much as possible and improve productivity of the surface mounting machine. In order to satisfy this requirement, component supplying apparatuses have tended to become thinner, and the interval at which component supplying apparatuses are installed in surface mounting machines has tend to been made as small as possible.

When a component supplying apparatus is made thinner and the interval at which part supplying apparatuses are installed is made smaller as described above, numerous types of component supplying apparatuses can be installed within a small area, thereby making it possible to improve the efficiency of setup work. However, in the case of reducing the installation interval of component supplying apparatuses in this manner, problems occur when using a wide reel. Namely, when a configuration is employed that a reel is held with a component supplying apparatus when feeding tape as in the Patent Document 1, since the reel ends up protruding in the direction of width from the component supplying apparatus in the case of a narrow component supplying apparatus, the reel ends up interfering with the adjacent component supplying apparatuses. Thus, it becomes necessary to either not arrange component supplying apparatuses in the adjacent space or hold the reel using a special structure so as not to interfere with the adjacent component supplying apparatuses.

DISCLOSURE OF THE INVENTION

In order to solve this problem, a configuration has been conceived that a section where the reel is installed is composed separately from the component supplying apparatus as a method for enabling component supplying apparatuses to be arranged at a narrow pitch even in the case of using somewhat wide reels. If a reel holder is provided separately from the component supplying apparatus in this manner, a greater degree of freedom can be adopted for the arrangement that the reel does not interfere on the reel holder even if component supplying apparatuses are arranged at a narrow pitch, thereby enabling tape to be supplied favorably. However, in the case of using a reel holder separate from a component supplying apparatus in this manner, it is difficult to integrally manage the component supplying apparatus and the reel when components are not being supplied (such as before and after mounting on a surface mounting machine or during maintenance), resulting in inconvenience particularly in the case of relocating the component supplying apparatus.

With the foregoing in view, an object of the present invention is to provide a configuration that facilitates integral management of a component supplying apparatus and a reel when not supplying components, and enables the component supplying apparatus to be made compact when not integrally managing the component supplying apparatus and the reel.

The present invention provides a component supplying apparatus removably mounted on a surface mounting machine, and having an apparatus main body section provided with a feeder for feeding a tape, which holds components at fixed intervals, toward a prescribed component supplying position by pulling out the tape from a reel, and a main body frame for holding the feeder; or a surface mounting machine provided with this component supplying apparatus, wherein a reel holder is provided which is mounted on the apparatus main body section and is displaced between a holding position where the reel is held and a storing position where the reel is not held.

According to this invention, since a reel holder is provided that is displaced between a holding position and a storing position, a component supplying apparatus and a reel can be integrally managed by holding the reel with the reel holder when not supplying components. On the other hand, in the case of not integrally managing the reel and the component supplying apparatus, the reel holder is stored at the storing position enabling the component supplying apparatus to be configured compactly.

The following configuration is preferable as an embodiment of the present invention.

A configuration can also be employed that a guide passage for guiding the tape is provided in the apparatus main body section, and the reel holder holds the reel in a form in which the reel is arranged to the side of or below the guide passage.

In this way, the reel can be held using a space to the side of or below the guide passage. In addition, since the reel is held to the side of or below the guide passage, a configuration can be obtained that the component supplying apparatus does not take up a space to the front or back or above, thereby facilitating integral transport of the component supplying apparatus and the reel.

In addition, the feeder can be made to feed the tape only from the reel held on a reel holder separate from the apparatus main body section.

In this way, since it is not necessary to hold the reel with the apparatus main body section when supplying components, the configuration of the apparatus main body section can be composed compactly and easily. In addition, even in a configuration that the apparatus main body section and reel are forced to be arranged separately when supplying components in this manner, the component supplying apparatus and the reel can be easily integrated when not supplying components such as when relocating, thereby making it possible to effectively facilitate management.

In addition, a configuration can also be employed that the reel holder has an engaging section engageable with the reel at the holding position, and the engaging section protrudes to the widthwisely outside of the apparatus main body section at the holding position, and is stored in a widthwisely inner region of the apparatus main body section at the storing position.

In this way, a configuration can be obtained that the reel can be easily and preferably held widthwisely outside of the apparatus main body section, and does not occupy an increased space in a direction other than the direction of width when held.

In this case, a configuration can be employed that the engaging section protrudes farther to the side than the width of the apparatus main body section beyond the apparatus main body section at the holding position.

In this way, a configuration can be obtained that a reel having a width larger than the width of the apparatus main body section can be stably held at the holding position.

In addition, a configuration can be employed that the apparatus main body section is provided with a sidewall section that covers at least one side in the direction of width of the feeder, and the reel holder has an arm section, which extends in a direction along the sidewall section at the holding position, and is folded in a region within the apparatus main body section or position adjacent to the apparatus main body section at the storing position, and a supporting section, which protrudes from the arm section and supports the reel at the holding position.

In this way, a configuration can be obtained that the reel can be easily and preferably held at a position along the sidewall section of the apparatus main body section, and not occupy an increased space in the direction of width when held.

In addition, the component supplying apparatus as described above may be provided with an urger for urging the reel holder from the holding position to the storing position.

In this way, the reel holder can be maintained at the storing position when not holding a reel.

According to the present invention, since the reel holder is provided displaced between a holding position and a storing position, the component supplying apparatus and a reel can be integrally managed by holding the reel with the reel holder when not supplying components. On the other hand, in the case that the reel and the component supplying apparatus are not integrally managed, the reel holder is stored at the storing position, thereby enabling the component supplying apparatus to be compactly configured.

BEST MODE FOR CARRYING OUT THE INVENTION

First Embodiment

The following provides an explanation of a first embodiment of the present invention with reference to the drawings.

1. Overall Configuration

Figure 1:
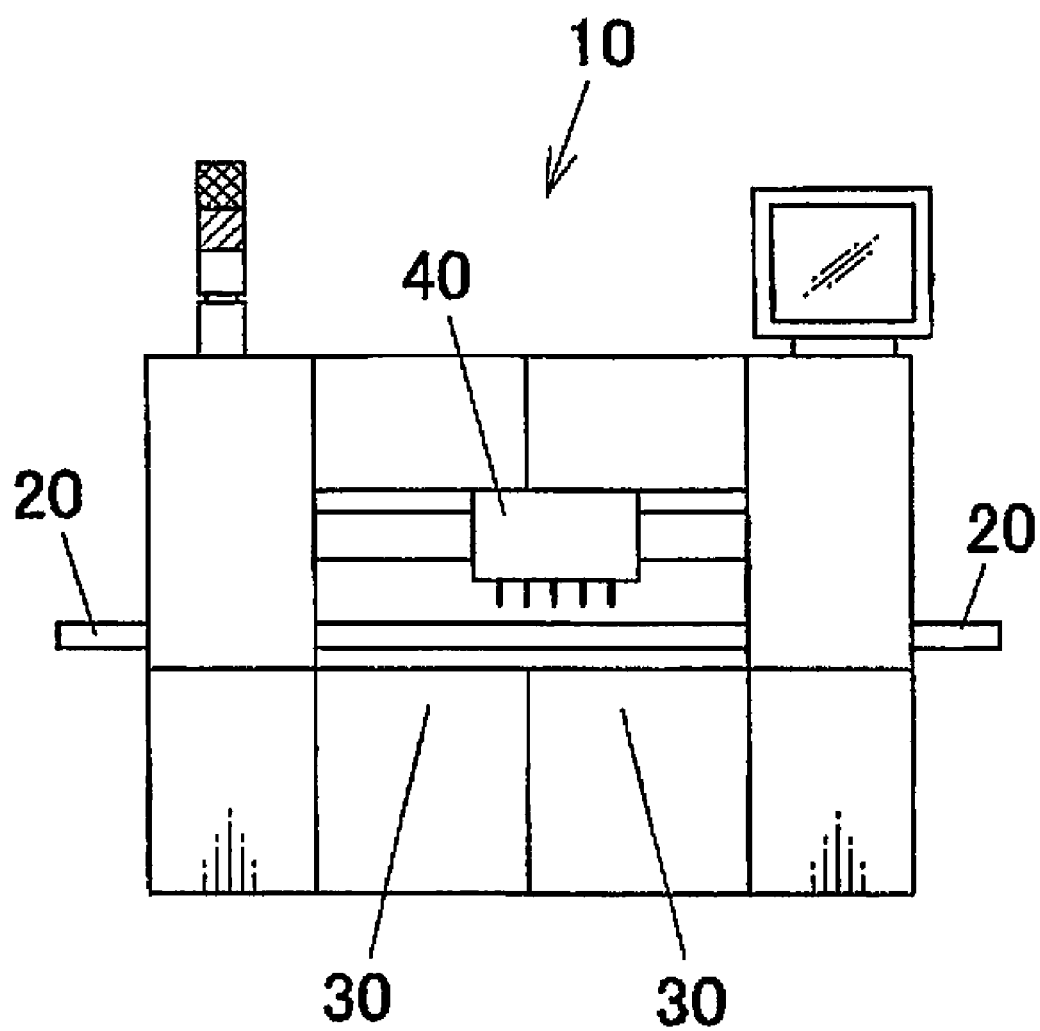
FIG. 1 is a front view exemplifying a surface mounting machine of first embodiment of the present invention.
Figure 2:
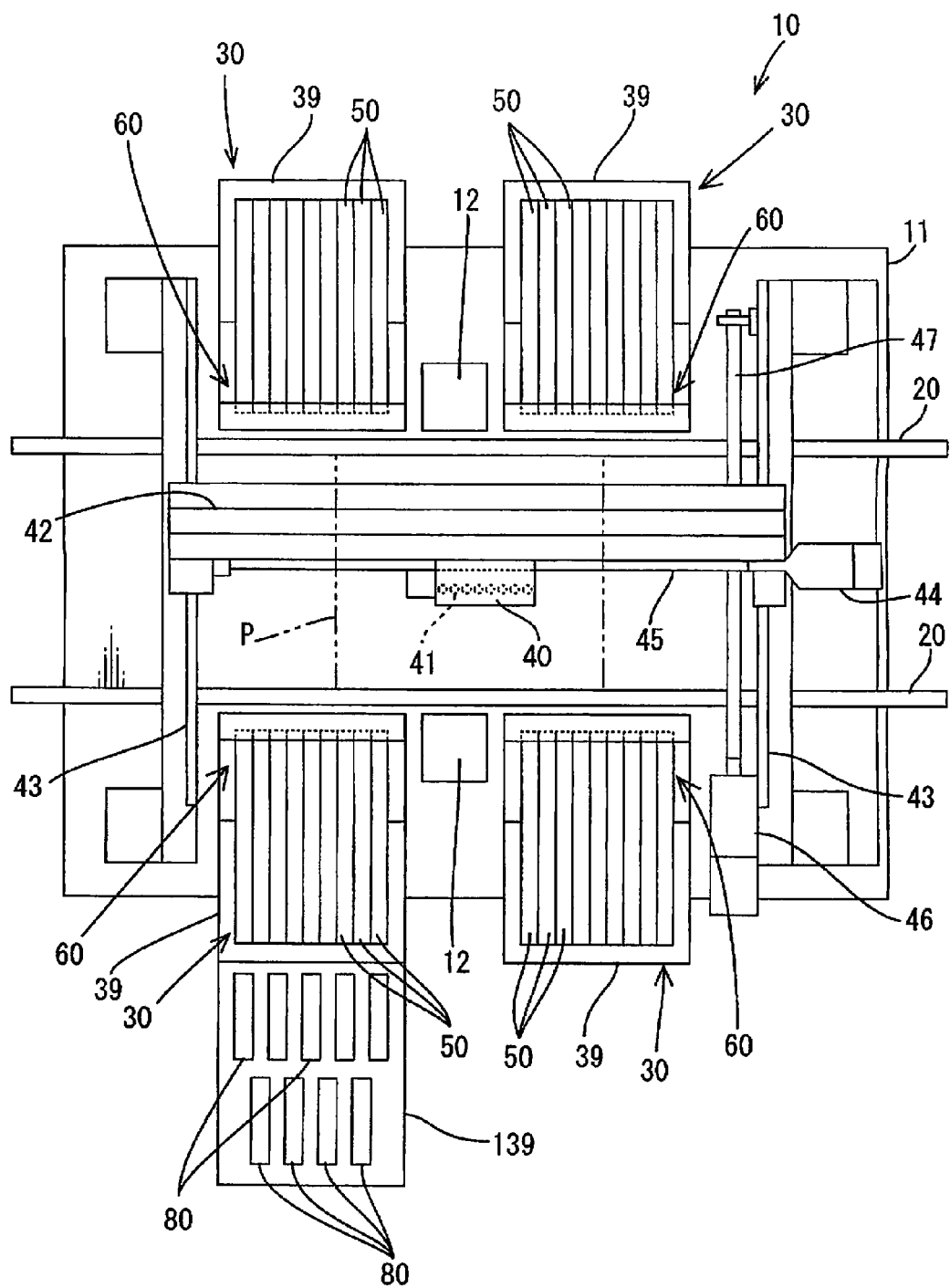
FIG. 2 is an overhead view of the surface mounting machine shown in FIG. 1.
Figure 3:
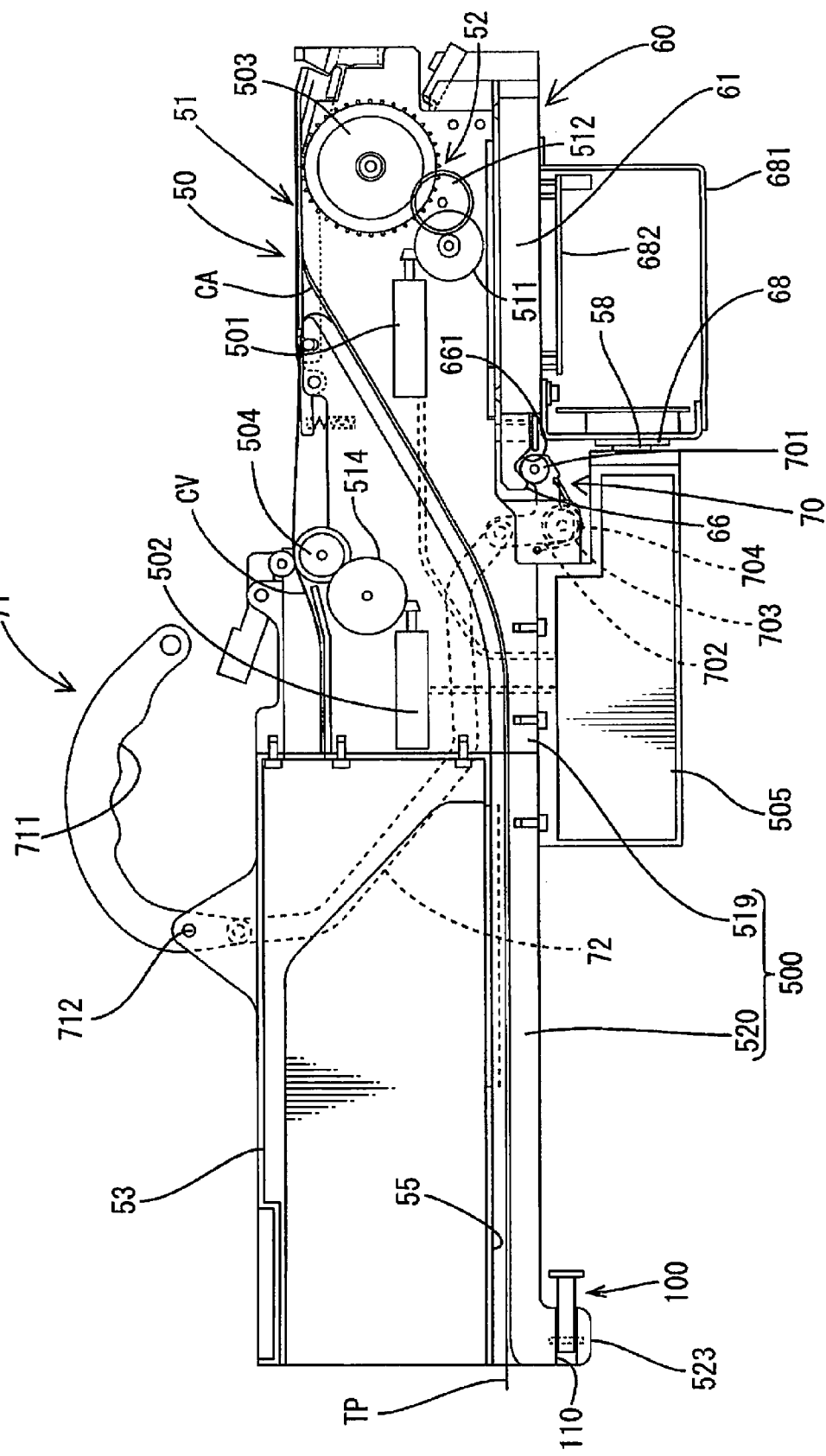
FIG. 3 is an explanatory diagram showing the state that a component supplying apparatus is mounted on a component supplying apparatus mounting section in the surface mounting machine shown in FIG. 1.
Figure 4:
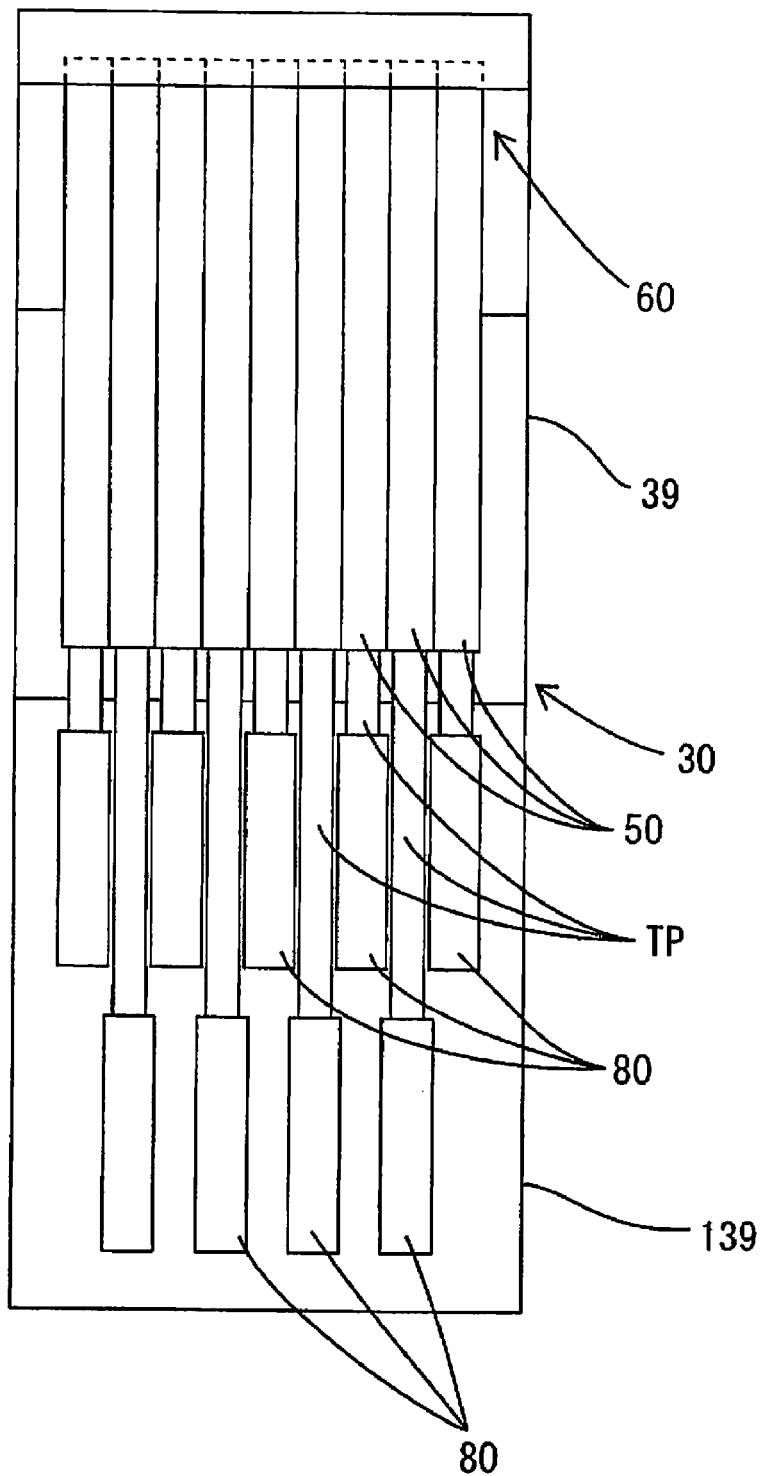
FIG. 4 is an explanatory diagram explaining the state that a component supplying apparatus and a tape are arranged in the surface mounting machine shown in FIG. 1.

FIG. 1 is a front view showing a surface mounting machine of a first embodiment of the present invention. FIG. 2 is an overhead view of the surface mounting machine of FIG. 1. In addition, FIG. 3 is an explanatory diagram showing the state that a component supplying apparatus 50 is mounted on a component supplying apparatus mounting section 60, and FIG. 4 is an explanatory diagram explaining the state that a plurality of component supplying apparatuses 50 and tapes 80 are arranged on a surface mounting machine 10. Furthermore, a sidewall section 522 (see FIG. 5) on one side is omitted from FIG. 3.

As shown in FIGS. 1 and 2, the surface mounting machine 10 is provided with conveyors 20 for transporting a printed board P arranged on a base 11, component supplying sections 30 arranged on both sides of the conveyors 20, and a head unit 40 for mounting electronic components provided above the base 11.

The head unit 40 is able to move over a region covering the component supplying sections 30 and a mounting position on the printed board P so as to enable electronic components to be picked up from the component supplying sections 30 and mounted on the printed board P. More specifically, the head unit 40 is movably supported in the direction of the X-axis (direction in which boards are transported by the conveyors 20) by a head unit supporting member 42 extending in the direction of the X-axis, while the head unit supporting member 42 is movably supported in the direction of the Y-axis (direction perpendicular to the X-axis in the horizontal plane) by guide rails 43 extending in the direction of the Y-axis at both ends thereof. The head unit 40 is driven in the direction of the X-axis by an X-axis motor 44 by means of ball screw shaft 45, while the head unit supporting member 42 is driven in the direction of Y-axis by a Y-axis motor 46 by means of a ball screw shaft 47.

In addition, a plurality of heads 41 are installed in a row in the direction of the X-axis on the head unit 40. Each of the heads 41 is driven vertically (direction of the Z-axis) by a vertical drive mechanism having a Z-axis motor for the drive source thereof, and are driven in a direction of rotation (direction of the R-axis) by a rotary drive mechanism having an R-axis motor for the drive source thereof.

A suction nozzle for suctioning an electronic component and mounting on a board is provided on the distal end of each head 41. Negative pressure is supplied to each nozzle from a negative pressure device not shown during component suctioning, enabling each nozzle to suction and pick up an electronic component by suction force attributable to that negative pressure.

Furthermore, in FIG. 2, reference numeral 12 indicates cameras capable of detecting positional shifts of components relative to the suction nozzles 41 by capturing images of the state of components suctioned with the head unit 40.

The component supplying sections 30 are provided at a total of four locations at respective upstream and downstream locations in front of and to the rear of the conveyors 20. Each component supplying section 30 is provided with a component supplying apparatus mounting section 60 capable of arranging and mounting a plurality of component supplying apparatuses 50 in the manner of tape feeders and the like. Each component supplying apparatus 50 is mounted on the component supplying apparatus mounting section 60 so as to be able to slide in the horizontal direction perpendicular to the direction in which they are arranged.

In this embodiment, a component supplying apparatus mounting carriage 39 is attached to each component supplying section 30 so as to be able to be removed from the main body of the surface mounting machine 10, while the component supplying apparatus mounting section 60 is provided on each component supplying apparatus mounting carriage 39.

2. Component Supplying Apparatus

The following provides a detailed description of the component supplying apparatus 50. As shown in FIGS. 1 and 3, a feeder plate 61, on which a plurality of component supplying apparatuses 50 are mounted in a row arrangement, is provided on the component supplying apparatus mounting section 60 provided on the surface mounting machine 10, and each component supplying apparatus 50 is removably mounted on this feeder plate 61. Furthermore, in the present description, the "direction of width" of the component supplying apparatus 50 refers to the direction of thickness of that component supplying apparatus 50. In addition, the rear portion of the component supplying apparatus 50 is the portion on which the reel 80 is arranged, while the front portion is the portion to which tape moves from the reel 80.

As shown in FIG. 3, the component supplying apparatus 50 of the present embodiment is configured in the form of a motorized tape feeder that feeds a tape TP, which holds components at fixed intervals, with a feeding apparatus 52 provided inside an apparatus main body section 53, and as shown in FIGS. 1 and 4, sequentially pulls out the tape TP from the reel 80 held with a reel holder 139. Furthermore, in the present invention, the "apparatus main body section" refers to a main portion which the reel holder is excluded from the component supplying apparatus, and in the example shown in FIG. 3, the portion which the engaging section 110 is excluded from the component supplying apparatus 50 corresponds to the apparatus main body section 53.

As shown in FIG. 3, the feeding apparatus 52 (the feeding apparatus 52 is equivalent to one example of feeder) operates so as to feed components stored on the tape TP toward a prescribed component supplying position (location of a component extracting section 51), and is provided with a drive motor 501, a gear 511 driven by this drive motor 501, a gear 512 driven by engaging with the gear 511, and a sprocket 503 driven by the gear 512. The sprocket 503 functions so as to feed the tape TP to the front by engaging with the tape TP fed from the reel 80 at a position in front of the component extracting section 51, and rotating corresponding to driving force from the drive motor 501. Furthermore, engaging holes not shown are formed at a prescribed pitch in the tape TP, and each projection formed on the outer periphery of the sprocket 503 mutually engages with these engaging holes by being inserted therein.

The tape TP has small components such as ICs or transistors stored thereon at prescribed intervals, and employs a double-layer structure in which a carrier tape CA, which stores the components, and a cover tape CV, which covers the carrier tape CA, are superimposed. This tape TP is intermittently fed from the reel 80 by the previously described feeding apparatus 52, thereby feeding the components stored on the tape TP to the component extracting section 51, sequentially.

The cover tape CV is separated from the carrier tape CA at a location in back of the component extracting section 51, is turned around to the rear, and engages with a sprocket 504. Owing to that the cover tape CV is separated at a location in back of the component extraction section 51, components stored on the carrier tape CA are exposed in the component extraction section 51, and this exposed component is then picked up by the head unit 40 shown in FIGS. 1 and 2.

Drive force of a drive motor 502 is transmitted to the sprocket 504 for feeding the cover tape CV through a gear 514, and each projection formed on the outer periphery of the sprocket 504 respectively engages with engaging holes formed at a prescribed pitch in the cover tape CV. This sprocket 504 feeds only the cover tape CV toward a recovery box provided in the rear corresponding to feeding of the tape TP (and more specifically, feeding of the carrier tape CA) by the sprocket 503. Furthermore, in the present embodiment, the feeding speed of the tape TP by the sprocket 503 (feeding speed of the carrier tape CA) and the feeding speed of the cover tape CA by the sprocket 504 are roughly equal.

A controller 505 for controlling driving of the drive motors 501, 502 and the like is arranged in the lower section of the component supplying apparatus 50. A connector 58 is arranged on the front of the controller 505 for electrically connecting the controller 505 with a control section 682 on the component supplying apparatus mounting section 60. This connector 58 makes an electrical connection by being pushed into a connector 68 on the component supplying apparatus mounting section 60 by a sliding operation when the component supplying apparatus 50 is mounted on the component supplying apparatus mounting section 60. Being electrically connected with the component supplying apparatus mounting section 60, the component supplying apparatus 50 is supplied with electrical power for driving the drive motors 501 and 502 from the component supplying apparatus mounting section 60, while also exchanging drive signals for driving the drive motors 501 and 502 with the component supplying apparatus mounting section 60.

A fastener 70 for fastening the component supplying apparatus 50 to the component supplying apparatus mounting section 60 is provided on a lower portion of the component supplying apparatus 50. This fastener 70 is provided with an engaging roller 701 for engaging with a fastening recess 661 formed in a rear plate 66 of the component supplying apparatus mounting section 60, a switching operation member 702 to which the engaging roller 701 is attached, and a biasing spring 703. The switching operation member 702 has an L-shape when viewed from the side, and an intermediate shaft 704, provided at a bent intermediate section thereof, is rotatably attached to a frame 500 of the component supplying apparatus 50. The biasing spring 703 is coiled around the intermediate shaft 704 of the switching operation member 702, one end is fastened to the frame 500 of the component supplying apparatus 50, and the other end urges the switching operation member 702 in a direction in which it presses the engaging roller 701 against the fastening recess 661 (upward direction).

When the component supplying apparatus 50 is mounted on the component supplying apparatus mounting section 60, the engaging roller 701 is pressed against the fastening recess 661 by the biasing spring 703, thereby engaging with the fastening recess 661. Consequently, the fastener 70 fastens the component supplying apparatus 50 to the component supplying apparatus mounting section 60 in a fastened state by. In addition, the engaging roller 701 is pressed downward to release engagement with the fastening recess 661 owing to that the switching operation member 702 rotates in opposition to the biasing spring 703.

An operating lever 71, which functions as an operator for switching between the fastened state and released state of the fastener 70, is provided on an upper portion of the component supplying apparatus 50. The operating lever 71 is rotatably attached to the frame 500 of the component supplying apparatus 50 by a base section 712 of a grip section 711.

A linking plate 72, of which both sides are linked to the operating lever 71 and the fastener 70, respectively, is arranged on one side of the component supplying apparatus 50. The linking plate 72 transmits operating force applied to the operating lever 71 to the fastener 70, and when viewed from the front, is bent at a plurality of locations in the lengthwise direction thereof, and is composed of a metal plate having a thickness in the direction in which the component supplying apparatuses 50 are arranged. The linking plate 72 rotates the switching operation member 702 owing to that operating force causing rotation of the operating lever 71 is transmitted in the form of axial force acting mainly on the linking plate 72, thereby causing engagement and release of the engaging roller 701.

Figure 5:
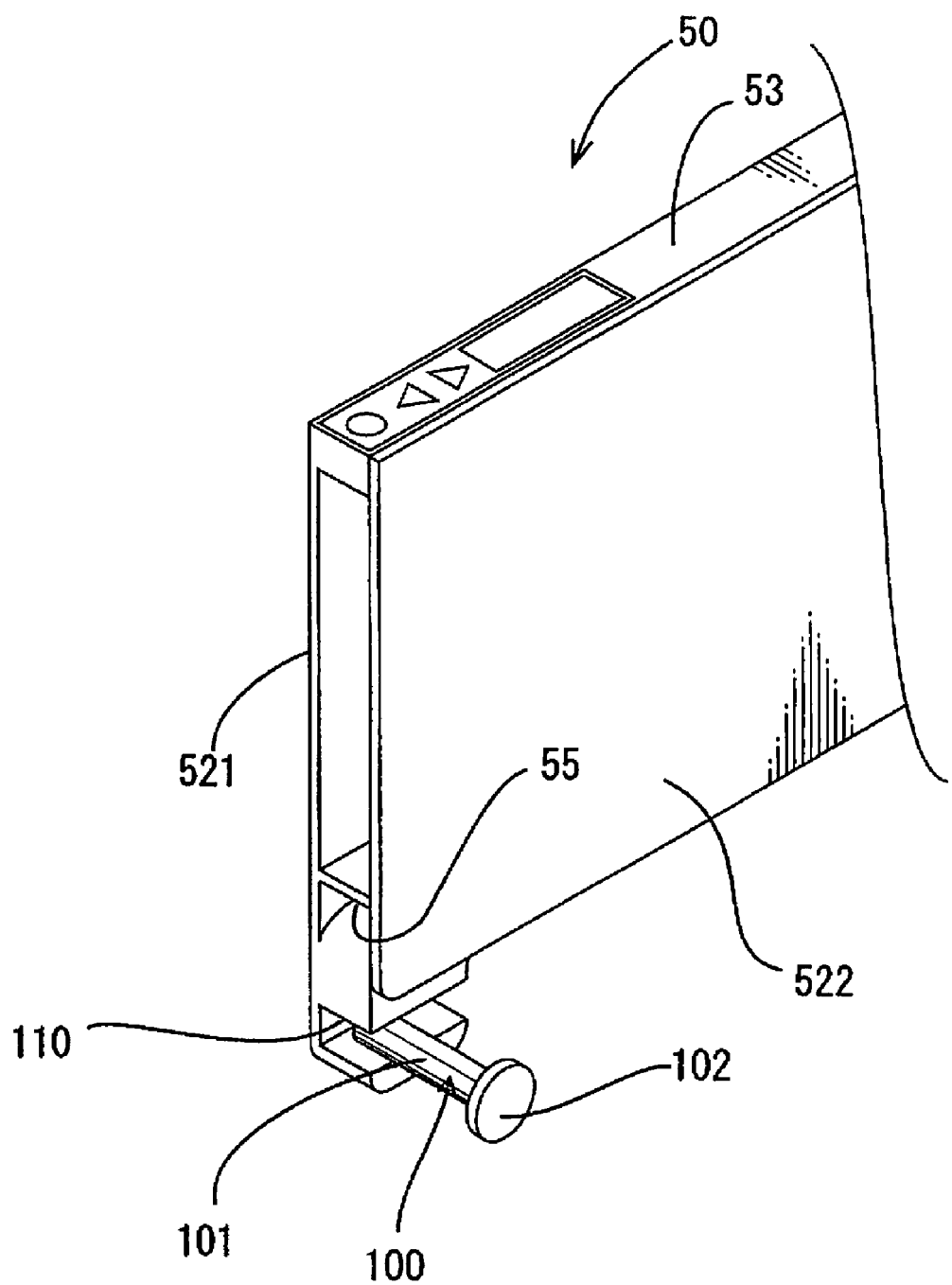
FIG. 5 is a perspective view showing the configuration of the component supplying apparatus shown in FIG. 3 in the vicinity of an engaging section.
Figure 6:
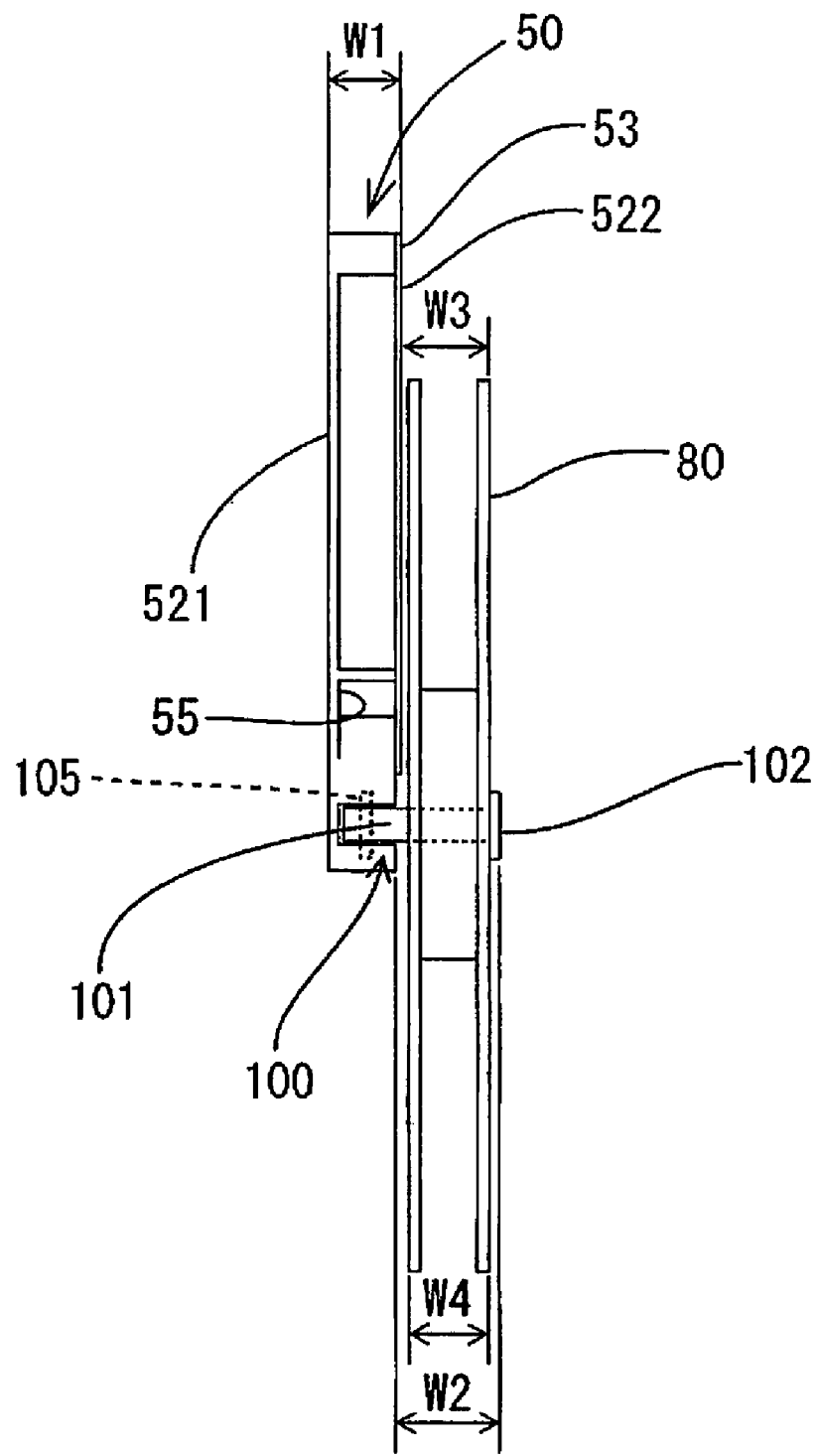
FIG. 6 is an explanatory diagram showing the state of a reel being held by an engaging section from the back of the component supplying apparatus shown in FIG. 3.
Figure 7:
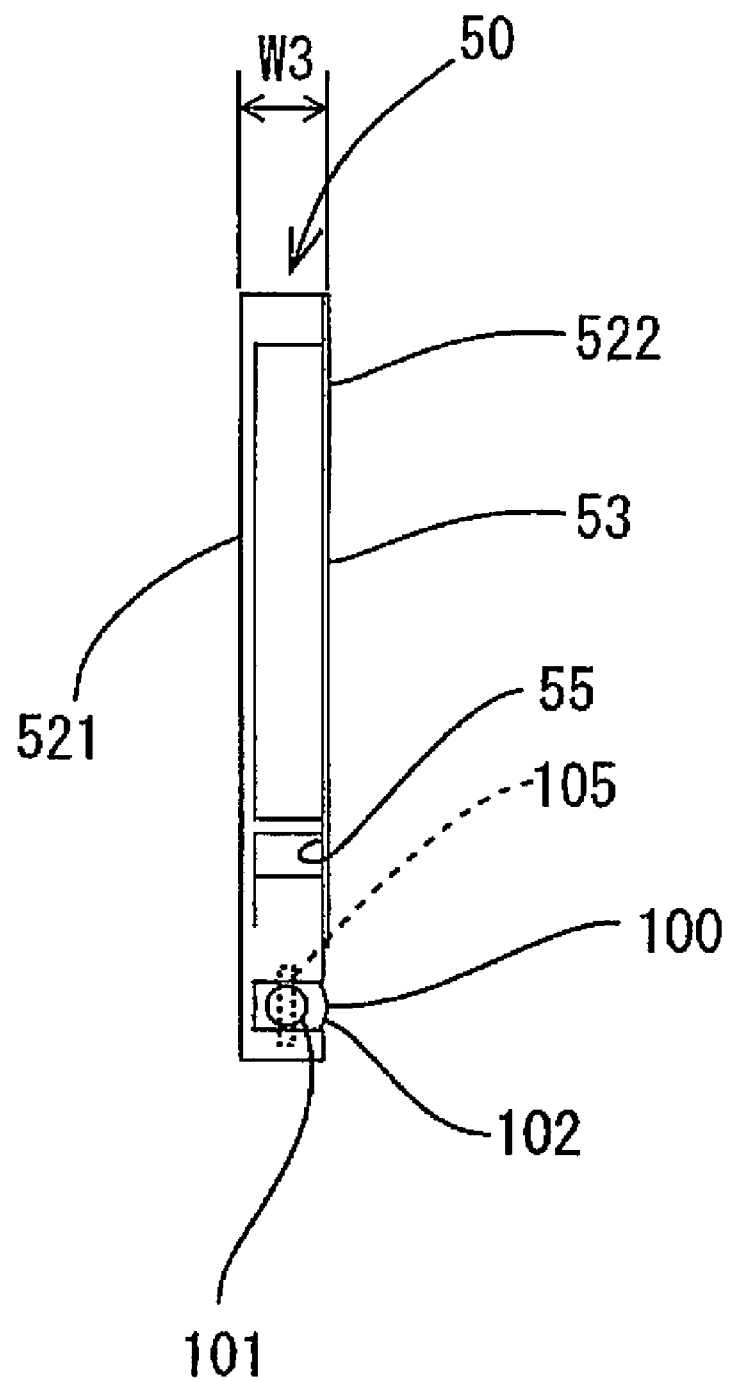
FIG. 7 is an explanatory diagram showing the state of an engaging section stored in the component supplying apparatus shown in FIG. 3 from the back thereof.

Next, an explanation is provided of an engaging section 100 corresponding to an example of a reel holder. Furthermore, FIG. 5 is a perspective view showing the configuration of the component supplying apparatus 50 in the vicinity of the engaging section 100. In addition, FIG. 6 is explanatory diagram showing the state of the reel 80 being held with the engaging section 100 from the back of the component supplying apparatus 50, while FIG. 7 is an explanatory diagram showing the state that the engaging section 100 is stored.

The engaging section 100 shown in FIG. 3, for example, is provided in the component supplying apparatus 50 of the present embodiment, and this engaging section 100 has a function which integrates the reel 80 and the component supplying apparatus 50 when not supplying components. Namely, in the present embodiment, although the feeding apparatus 52 of the component supplying apparatus 50 feeds the tape TP only from the reel 80 held by the reel holder 139 separate from the apparatus main body section 53 (namely, employs a configuration that the reel 80 is not held by the apparatus main body section 53 during feeding) as shown in FIGS. 3 and 4, the reel 80 can be held by the engaging section 100 by displacing the engaging section 100 to a holding position when not supplying components (see FIG. 6), thereby enabling both to be integrally managed.

Furthermore, as conceptually shown in FIG. 4, the reel holder 139 enables a plurality of reels 80 to be arranged in a zig-zag pattern. Since the reels 80 is rotatably held by a separate reel holder 139 when supplying components in this manner, the component supplying apparatuses 50 can be arranged adjacent to each other at a narrow pitch (for example, arranging the component supplying apparatuses 50 without hardly any interval there between as in FIG. 4) even in the case of using reels that are wider than the width of the component supplying apparatuses 50. Furthermore, although FIG. 4 shows an example of the reel holder 139 integrally configured with the component supplying apparatus mounting carriage 39, the component supplying apparatus mounting carriage 39 and the reel holder 139 may naturally be configured separately.

As shown in FIG. 3 and FIGS. 5 to 7, the engaging section 100 is provided with a cylindrical shaft section 101 and a flange-shaped flange section 102 formed on the distal end thereof, and is displaceably mounted to a rear frame 520 composing a portion of the apparatus main body section 53.

The rear frame 520 composes the main body frame 500 together with the front frame 519, and a groove 110 extending in a front and back direction is formed in a downward facing protrusion 523 formed in the bottom of the rear end of the rear frame 520. The end of the shaft section 101 on the opposite side from the flange section 102 is rotatably supported in this groove 110.

FIGS. 5 and 6 show the state that the engaging section 100 is at a holding position where the reel 80 is held, while FIG. 7 shows the state that the engaging section 100 is at a storing position where the reel 80 is not held. At the holding position shown in FIGS. 5 and 6, a configuration is employed that the engaging section 100 protrudes to the widthwisely outside of the apparatus main body section 53, and more specifically, protrudes farther to the side than a width W1 of the apparatus main body section 53 beyond the apparatus main body section 53 at the holding position as shown in FIG. 6 (namely, a protruding length W2 based on a wall surface of the sidewall section 522 on the protruding side is greater than the width W1 of the apparatus main body section 53). The engaging section 100 protruding in this manner engages with the reel 80 as shown in FIG. 6 and holds the reel 80 at the holding position by being passed through a center hole (not shown) formed in the center of the reel 80.

Furthermore, since a protruding length W3 of the shaft section 101 of the engaging section 100 of the present embodiment at the holding position (and more specifically, a protruding length from a wall surface of the sidewall section 522 at the holding position) is greater than the width W1 of the apparatus main body section 53, even if the width W4 of the reel 80 is roughly equal to or slightly greater than the width W1 of the apparatus main body section 53, the width of the reel 80 is able to be contained within the protruding region of the shaft section 101. Thus, even in the case of a reel 80 of a size larger than the width W1 of the apparatus main body section 53, it is contained within the protruding region of the shaft section 101 provided the width thereof is less than the protruding length W3 of the shaft section 101, and in this case, the vicinity of the end of the opening of the center hole of the reel 80 is locked by the flange section 102, thereby favorably preventing it from coming out.

In addition, as shown in FIG. 3 and FIGS. 5 to 7, although the apparatus main body section 53 of the component supplying apparatus 50 is provided with a guide passage 55 for guiding the tape TP over a prescribed position from the rear end to the front end of the main body frame 50, in the present embodiment, a region to the side of the guide passage 55 is used as a space for holding the reel 80. Namely, as shown in FIG. 6, the engaging section 100 is displaceably arranged in the vicinity of a section guided by the guide passage 55, and protrudes to the side beyond the region where the guide passage 55 is formed at the holding position. A configuration is employed that the reel 80 is held while in a state that the reel 80 is arranged to the side of the guide passage 55.

In addition, at the storing position, the engaging section 100 is folded so that the shaft section 101 is arranged along the groove 110, and is stored so that the lengthwise direction (axial direction) of the engaging section 100 is in the front and back direction of the component supplying apparatus 50. When in this stored state, since the entire engaging section 100 is stored in the widthwisely inner region of width of the apparatus main body section 53 as shown in FIG. 7, the engaging section 100 does not protrude to the outside from sidewall sections 521 and 522, thereby preventing the engaging section 100 from interfering with other apparatuses even if the component supplying apparatuses 50 are arranged adjacent to each other as shown in FIG. 4. Furthermore, since the diameter of the flange section 102 is equal to or smaller than the width W1 of the apparatus main body section 53, the flange section 102 does not protrude to the side even in the stored state shown in FIG. 7.

As has been described above, in the present embodiment, since the engaging section 100 (reel holder) is provided in the component supplying apparatus 50 that is displaced between a holding position and a storing position, the reel 80 can be held by the engaging section 101 and the component supplying apparatus and the reel 80 can be integrally managed when components are not supplied. On the other hand, when the reel 80 is not integrally managed with the component supplying apparatus 50, the engaging section 100 can be stored at the storing position enabling the component supplying apparatus 50 to be configured compactly.

In addition, the configuration is also employed that the guide passage 55 for guiding the tape TP is provided in the apparatus main body section 53, and the engaging section 100 holds the reel 80 in a state that the reel 80 is arranged to the side of the guide passage 55. Thus, the reel 80 can be stored by using the space to the side of the guide passage 55. In addition, since the reel 80 is held to the side of the guide passage 55, the configuration is attained that the component supplying apparatus 50 does not occupy an increased space to the front and back or upward, thereby facilitating integral transport of the component supplying apparatus 50 and the reel 80 in the held state.

In addition, the component supplying apparatus 50 is configured such that the tape TP is only fed from the reel 80 held by the reel holder 139 separate from the apparatus main body section 53. In this way, since the reel 80 is not required to be held by the apparatus main body section 53 when supplying components, the configuration of the apparatus main body section 53 can be composed compactly and easily. On the other hand, even in the configuration that the apparatus main body section 53 and the reel 80 are forced to be arranged separately when supplying components in this manner, the component supplying apparatus 50 and reel 80 can be easily integrated when not supplying components such as when relocating, thereby making it possible to effectively facilitate management.

In addition, a configuration is employed that the reel holder is provided in the form of the engaging section 100 for engaging with the reel 80 at the holding position, and the engaging section 100 protrudes to the widthwisely outside of the apparatus main body section 53 at the holding position, and is stored in a widthwisely inner region of the apparatus main body section 53 at the storing position. Thus, the reel 80 can be held easily and preferably the widthwisely outside of the apparatus main body section 53, thereby making the configuration that the reel does not occupy an increased space in a direction other than the direction of width (such as the front-back direction) when held.

In addition, the engaging section 100 is configured so as to protrude farther to the side than the width W1 of the apparatus main body section 53 beyond the apparatus main body section 53 at the holding position. Thus, the reel 80 having a width larger than the width W1 of the apparatus main body section 53 can be stably held at the holding position.

Second Embodiment

Figure 8:
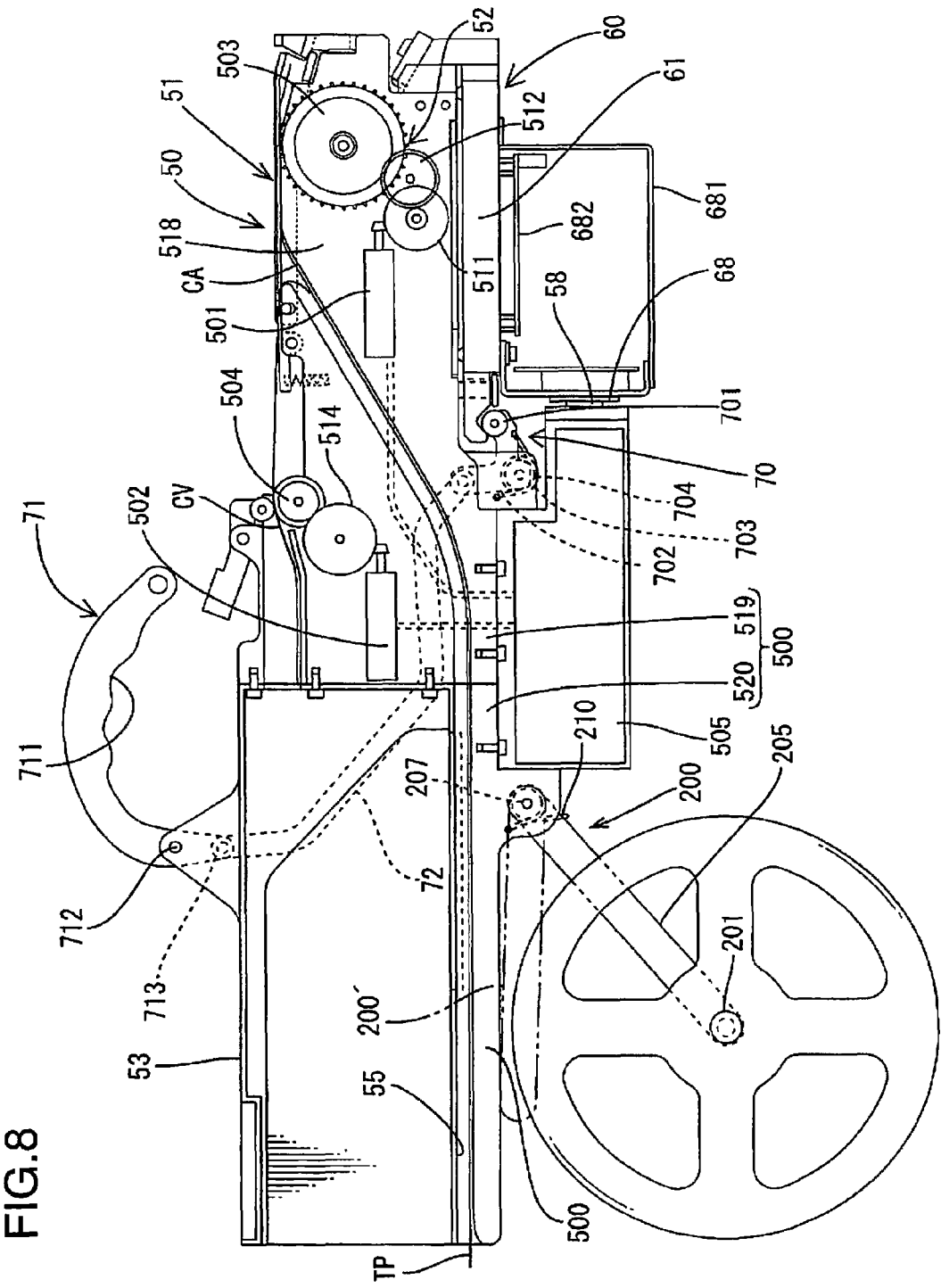
FIG. 8 is an explanatory diagram showing the state that a component supplying apparatus is mounted on a component supplying apparatus mounting section in a surface mounting machine of a second embodiment; and, FIG. 9 is an explanatory diagram explaining the state that a reel holding section is at a holding position in the component supplying apparatus shown in FIG. 8.
Figure 9:
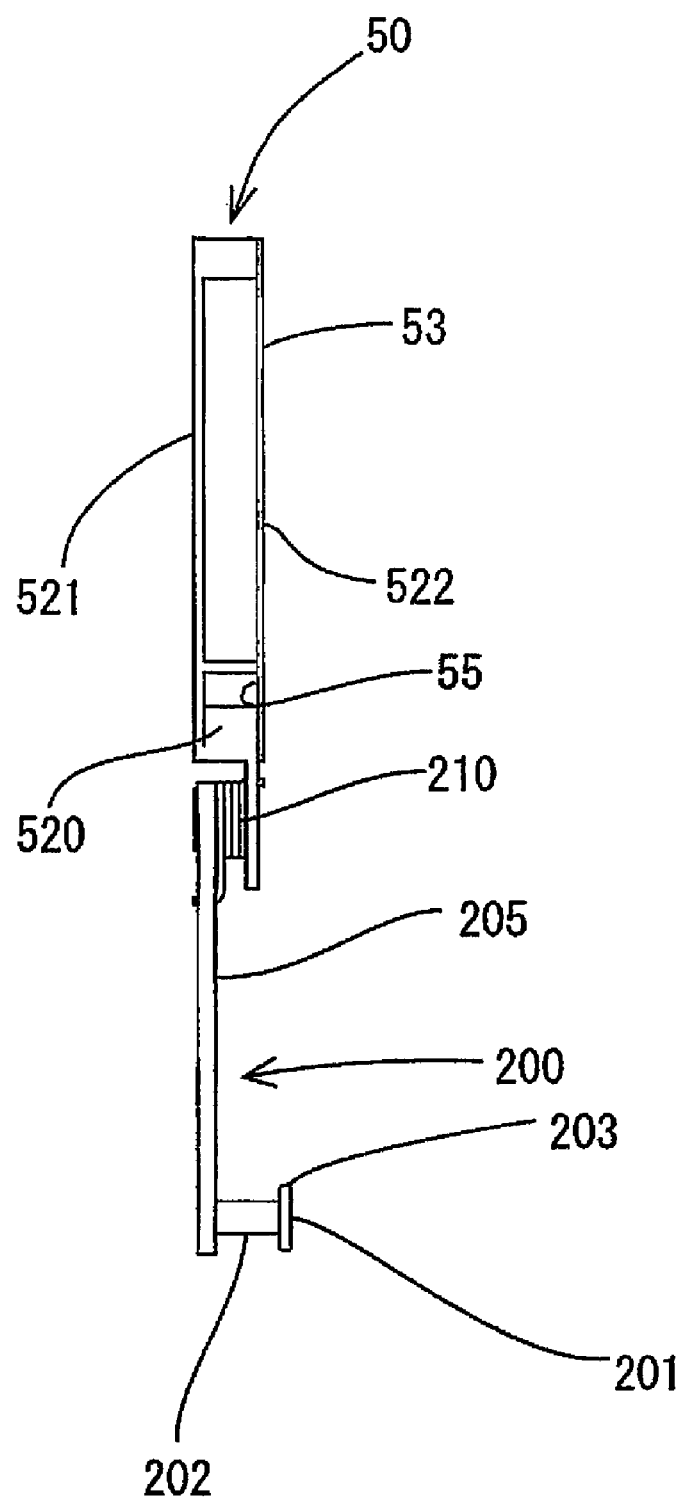

The following provides a description of a second embodiment of the present invention. FIG. 8 is an explanatory diagram showing the state of a component supplying apparatus mounted on a component supplying apparatus mounting section in a surface mounting machine of the second embodiment, while FIG. 9 is an explanatory diagram explaining the state that a reel holding section 200 is at a holding position in the component supplying apparatus of FIG. 8. The second embodiment is the same as the first embodiment with the exception of the configuration of the reel holder differing from that of the first embodiment. Namely, the second embodiment differs from the first embodiment in that the engaging section 100 of FIG. 3 and configuration in the vicinity thereof are omitted, while the reel holding section 200 of FIG. 8 and configuration in the vicinity thereof have been added, and the remainder of the configuration is the same as that of the first embodiment. Thus, the explanation focuses on those sections that are different, while the same reference numerals as the first embodiment are used to indicate similar sections and detailed explanations thereof are omitted.

As shown in FIG. 8, in the apparatus main body section 53 of the component supplying apparatus 50, one side of the feeding apparatus 52 in the direction of width is covered by a sidewall section 518 of the front frame 519, while the other side in the direction of width is covered by a sidewall section not shown arranged in opposition to this sidewall section 518.

The reel holding section 200 corresponding to the reel holder of the present embodiment is configured to have a long shape overall, and is configured so as to rotate centering on a rotating shaft 207 along the direction of width of the apparatus main body section 53. More specifically, the reel holding section 200 is provided with an arm section 205 and a supporting section 201 that protrudes from the arm section 205 in the direction of width, and employs the configuration that it is displaced between a holding position indicated with solid lines in FIG. 8 and a storing position indicated with double-dot broken lines corresponding to rotation of the arm section 205.

The arm section 205 is rotatably attached to the rear frame 520 composing a portion of the main body frame 500, and extends in a direction along the sidewall section 518 (FIG. 8) (more specifically, below the apparatus main body section 53) as shown in FIGS. 8 and 9 when being placed at the holding position, and is folded at a position adjacent to the apparatus main body section 53 as shown in FIG. 8 when being placed at the storing position.

As shown in FIGS. 8 and 9, the supporting section 201 is comprised of a shaft section 202 fastened to the arm section 205 and protruding at a right angle to this arm section 205, and a flange section 203 connected to the distal end of the shaft section 202, and generally protrudes from the arm section 205 in the direction of width of the apparatus main body section 53.

In the present embodiment, the supporting section 201 and the reel 80 engage with each other and the reel 80 is supported at a position below the apparatus main body section 53 as shown in FIG. 8 owing to that the supporting section 201 of the reel holding section 200 at the holding position is inserted into a center hole (not shown) provided in the reel 80.

In addition, in the present embodiment, a torsion coil spring 210 is provided as an urger for urging the reel holding section 200 from the holding position to the storing position. The torsion coil spring 210 is arranged around the rotating shaft 207 for rotatably supporting the arm section 205, one end engages with the arm section 205 while the other end engages with the rear frame 520, and generates an elastic force so as to cause the arm section 205 at the holding position to move to the storing position indicated with double-dot broken lines as shown in FIG. 8.

As has been described above, in the presence embodiment, the reel holding section 200 corresponding to the reel holder employs a configuration having the arm section 205 extending in a direction along the sidewall section 521 that folds to a position adjacent to the apparatus main body section 53 at the holding position, and a supporting section 201 that protrudes from the arm section 205 and supports the reel 80 at the holding position. Thus, the reel 80 can be easily and preferably held at a position along a sidewall section of the apparatus main body section 53, making the configuration that it does not occupy an increased space in the direction of width in the held state.

In addition, an urger for urging the holder from the holding position to the storing position is provided in the component supplying apparatus as described above. Thus, the reel holding section 200 can be maintained at a stored position when not holding the reel 80, making the configuration having extremely superior workability.

Although the present invention has been described based on the first and second embodiments, the present invention is not limited to these configurations, but rather may be suitably modified in the manner described below.

Although the first embodiment shows the configuration that the engaging section 100 is stored in a widthwisely inner region of the apparatus main body section 53 when being placed at the storing position, it may be appreciated to adopt a configuration that the engaging section only protrudes slightly to a widthwisely outside of the apparatus main body section when being placed at the storing position.

Although the first embodiment shows the configuration that the engaging section 100 protrudes farther to the side than the width of the apparatus main body section 53 beyond the apparatus main body section 53 when being placed at the holding position, the protruding length may be roughly equal to the width of the apparatus main body section or smaller than the width of the apparatus main body section.

Although the configuration including the urger is disclosed only in the second embodiment, a similar urger may also be provided so as to urge the engaging section 100 of the first embodiment to the storing position. In addition, the urger is not limited to the torsion coil spring, but rather various other types of spring, such as a compression spring, may be used instead.

Although the second embodiment shows the configuration in which the reel holding section 200 provided with the arm section 205 and the supporting section 201 extends below the apparatus main body section 53, it may be appreciated to adopt a configuration that it extends in another direction. For example, the reel holding section provided with the arm section and the supporting section may extend to the rear.

Although the configuration that the reel holder is displaced by rotation is disclosed in the first and second embodiments, it may be appreciated to adopt a configuration that the reel holder is displaced by sliding and the like.

Although the second embodiment shows the configuration in which the reel holding section 200 is folded at a position adjacent to the apparatus main body section 53 at the storing position, it may be appreciated to adopt a configuration that the reel holder is folded so as to be contained in a region within the apparatus main body section.

Although the foregoing embodiments show the so-called motorized component supplying apparatus in which a motor is provided for the feeder, the component supplying apparatus may also be driven by a driver other than a motor (such as the so-called mechanical component supplying apparatus).

Although the foregoing embodiments show the configuration in which the tape TP is fed only from the reel 80 held by the reel holder 139 independently from the apparatus main body section 53, it may be appreciate to adopt a configuration that the tape is fed from a reel held at the holding position.

Although a reel holder is only provided in a portion of the component supplying sections 30 in the surface mounting machine 10 in the foregoing embodiments, it may be appreciated to adopt a configuration that the reel holder 139 is provided for all of the component supplying sections 30.

The invention claimed is:

1. A component supplying apparatus removably mounted on a surface mounting machine, and having an apparatus main body section provided with a feeder for feeding a tape, which holds components at fixed intervals, toward a prescribed component supplying position by pulling out the tape from a reel, and a main body frame for holding the feeder, the component supplying apparatus comprising:
a reel holder mounted on the apparatus main body section and displaced between a holding position where the reel is held and a storing position where the reel is not held, wherein the reel holder has an engaging section engageable with the reel at the holding position, and
the engaging section protrudes to the widthwisely outside of the apparatus main body section at the holding position, and is stored in a widthwisely inner region of the apparatus main body section at the storing position.

2. The component supplying apparatus according to claim 1, wherein a guide passage for guiding the tape is provided in the apparatus main body section, and
the reel holder holds the reel in a form in which the reel is arranged to the side of or below the guide passage.

3. The component supplying apparatus according to claim 1, wherein the feeder feeds the tape only from the reel held on a reel holder separate from the apparatus main body section.

4. The component supplying apparatus according to claim 1, wherein the engaging section protrudes farther to the side than the width of the apparatus main body section beyond the apparatus main body section at the holding position.

5. The component supplying apparatus according to claim 1, comprising an urger for urging the reel holder from the holding position to the storing position.

6. A surface mounting machine, comprising the component supplying apparatus according to claim 1.

7. A component supplying apparatus removably mounted on a surface mounting machine, and having an apparatus main body section provided with a feeder for feeding a tape, which holds components at fixed intervals, toward a prescribed component supplying position by pulling out the tape from a reel, and a main body frame for holding the feeder, the component supplying apparatus comprising:
a reel holder mounted on the apparatus main body section and displaced between a holding position where the reel is held and a storing position where the reel is not held,
wherein the apparatus main body section is provided with a sidewall section that covers at least one side in the direction of width of the feeder, and
the reel holder has: an arm section, which extends in a direction along the sidewall section at the holding position, and is folded in a region within the apparatus main body section or position adjacent to the apparatus main body section at the storing position; and a supporting section, which protrudes from the arm section and supports the reel at the holding position.

8. The component supplying apparatus according to claim 7, comprising an urger for urging the reel holder from the holding position to the storing position.

9. The component supplying apparatus according to claim 7, wherein a guide passage for guiding the tape is provided in the apparatus main body section, and the reel holder holds the reel in a form in which the reel is arranged to the side of or below the guide passage.

10. The component supplying apparatus according to claim 7, wherein the reel holder is adapted to hold the reel so that the tape is fed from the reel held at the holding position.

11. A surface mounting machine, comprising the component supplying apparatus according to claim 7.

12. The component supplying apparatus according to claim 7, wherein the feeder feeds the tape only from the reel held on a reel holder separate from the apparatus main body section.

* * * * *